(12) United States Patent
Xu et al.

(10) Patent No.: US 7,088,138 B2
(45) Date of Patent: Aug. 8, 2006

(54) SYMMETRIC AND NON-STACKED XOR CIRCUIT

(75) Inventors: Jianping Xu, Portland, OR (US);
Fabrice Paillet, Hillsboro, OR (US);
Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 58 days.

(21) Appl. No.: 10/929,412

(22) Filed: Aug. 31, 2004

(65) Prior Publication Data
US 2006/0044010 A1 Mar. 2, 2006

(51) Int. Cl.
H03K 19/21 (2006.01)

(52) U.S. Cl. ........................................ 326/55; 326/115

(58) Field of Classification Search .................. 326/52, 326/55, 115
See application file for complete search history.

(56) References Cited

U.S. PATENT DOCUMENTS 6,008,670 A * 12/1999 Pace et al. .................. 326/115
6,094,074 A * 7/2000 Chi et al. .................... 326/115
6,188,339 B1 * 2/2001 Hasegawa .................... 341/101

OTHER PUBLICATIONS

Bernard Antaki, et al.; "Design for Testability Method for CML Digital Circuits;" Ecole Polytechnique, Montreal, Quebec, Canada & Nortel Networks, Ottawa, Ontario, Canada, date unknown.
M. Alioto et al., "Modeling and Optimized Design of Current Mode MUX/XOR and D Flip-Flop;" IEEE Transactions on Circuits and Systems—II: Analog and Digital Signal Processing vol. 47, No. 5, May 2000.
K. Zhou et al., Implementation of Gigahertz 1-bit Full Adder on SiGe FPGA; Rensselaer Polytechnic Institute, Troy NY, date unknown.
Jafar Savoj et al. "A 10-Gb/s CMOS Clock and Data Recovery Circuit;" 2000 Symposium on VLSI Circuits Digest of Technical Papers pp. 136-139; date at least 2000, no month.

* cited by examiner

Primary Examiner—James H. Cho
(74) Attorney, Agent, or Firm—Fleshner & Kim, LLP

(57) ABSTRACT

A CML XOR logic circuit is provided that includes a pair of pull-up transistors, a pair of current source transistors and a logic switch network coupled between the pull-up transistors and the current source transistors. The logic switch network including a plurality of transistors divided into a first branch, a second branch and a third branch. A tail current flows through the first branch, the second branch or the third branch based on at least two input signals to the plurality of transistors.

25 Claims, 3 Drawing Sheets

SYMMETRIC AND NON-STACKED XOR CIRCUIT

FIELD

Embodiments of the present invention may relate to logic circuits. More particularly, embodiments of the present invention may relate to a current mode logic (CML) XOR circuit.

BACKGROUND

One type of logic gate is an XOR gate, which may also be called an exclusive OR gate. An XOR gate (or XOR circuit) acts in a same way as a logical "either/or." That is, an output is HIGH (or logical "1") if either, but not both, inputs are HIGH. The output is LOW (or logical "0") if both inputs are LOW or if both inputs are HIGH. Stated differently, the output is HIGH if the inputs are different, but LOW if the inputs are the same.

XOR gates and other logic circuits have been provided in CML CMOS technology to enable high-speed circuit applications. CML logic may include current source devices, pull-up devices and pull-down devices. These applications may include, but are not limited to phase detectors of phase-locked-loops (PLLs) or delay-locked-loops (DLLs) and optical interconnects.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

The following represents brief descriptions of the drawings in which like reference numerals represent like elements and wherein.

DETAILED DESCRIPTION

Figure 1:
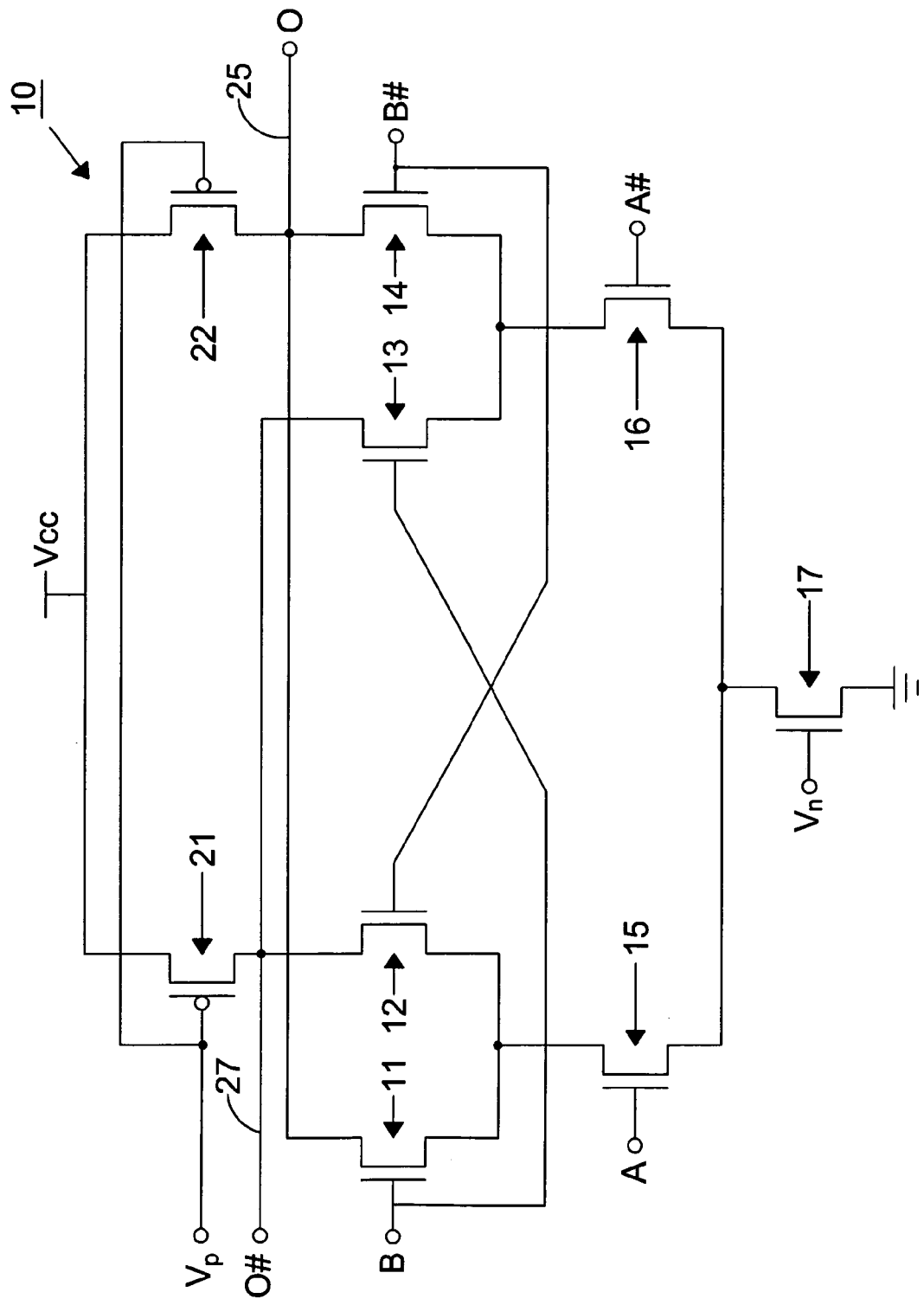
FIG. 1 shows an XOR circuit according to an example arrangement.

In the following detailed description, like reference numerals and characters may be used to designate identical, corresponding or similar components in differing figure drawings. Well-known power/ground connections to integrated circuits (ICs) and other components may not be shown within the figures for simplicity of illustration and discussion. Where specific details are set forth in order to describe example embodiments of the invention, it should be apparent to one skilled in the art that the invention can be practiced without these specific details.

Further, while values or signals may be described as HIGH ("1") or LOW ("0"), these descriptions of HIGH and LOW are intended to be relative to the discussed arrangement and/or embodiment. That is, a value or signal may be described as HIGH in one arrangement although it may be LOW if provided in another arrangement, such as with a change in logic. The terms HIGH and LOW may be used in an intended generic sense. Embodiments and arrangements may be implemented with a total/partial reversal of the HIGH and LOW signals by a change in logic.

FIG. 1 shows an XOR circuit 10 according to an example arrangement. Other arrangements are also possible. More specifically, FIG. 1 shows input signals A and B as well as their complementary input signals A# and B#. The XOR circuit 10 may include a plurality of NMOS transistors 11, 12, 13, 14, 15, 16 and 17, as well as a plurality of PMOS transistors 21 and 22. Input signal A may be applied to a gate of transistor 15, input signal B may be input to a gate of transistor 11 and to a gate of transistor 13, complementary input signal A# may be input to a gate of transistor 16 and complementary input signal B# may be input to a gate of transistor 14 and to a gate of transistor 12. As such, input signals A, B, A# and B# control the switching operations of transistors 11–16, and as will be described below control the logical XOR output signal.

Bias voltage Vn may be applied to a gate of transistor 17 and a bias voltage of Vp may be applied to a gate of transistor 21 and to a gate of transistor 22. An output signal O may be provided on signal line 25 and a complementary output signal O# may be provided on signal line 27 based on operations of the XOR circuit 10. The signal line 25 may be coupled to a node between transistor 22, transistor 14 and transistor 11. Signal line 27 may be coupled to a node between transistor 21, transistor 12 and transistor 13.

Transistor 17 that is biased by Vn may operate in a saturation region and may provide a current flow for either a left branch of the XOR circuit 10 or a right branch of the XOR circuit 10. The left branch of the XOR circuit 10 may include transistors 11, 12 and 15. The right branch of the XOR circuit 10 may include transistors 13, 14 and 16.

Transistors 21 and 22 biased by the voltage Vp may operate in a linear region and may serve as pull-up resistors (or pull-up logic). On the other hand, transistors 11, 12, 13, 14, 15 and 16 may act as pull-down resistors (or pull-down logic switches) to turn ON or turn OFF a current path on either the left branch or the right branch of the XOR circuit 10. For example, transistors 11 and 15 may control current flow through the left branch of the XOR circuit 10 and transistors 14 and 16 may control current flow through the right branch of the XOR circuit 10.

CML XOR circuit 10 of FIG. 1 includes a current source (i.e., transistor 17) to provide tail current, pull-down logic (i.e., transistors 11–16), and pull-up logic (i.e., transistors 21–22). The current source may help provide tail current that flows through either the left branch or the right branch based on the two input signals A and B (and thus the two complementary input signals A# and B#).

The CML logic may include a lower part (such the transistor 17), a middle part (such as transistors 11–16) having a logic depth of two and an upper part (such as transistors 21–22). In the CML XOR circuit 10 of FIG. 1, the stacking depth is 2 (or two logic levels). The logical depth (or stacking depth) of this CML logic circuit is based on the pull-down logic (or middle part) of the circuit. Since a delay of the XOR circuit is proportional to the logic depth, then a non-stacking CML circuit (or gate) may be better used with high-speed circuits in order to avoid delays caused by stacked CML XOR circuits.

Figure 2:
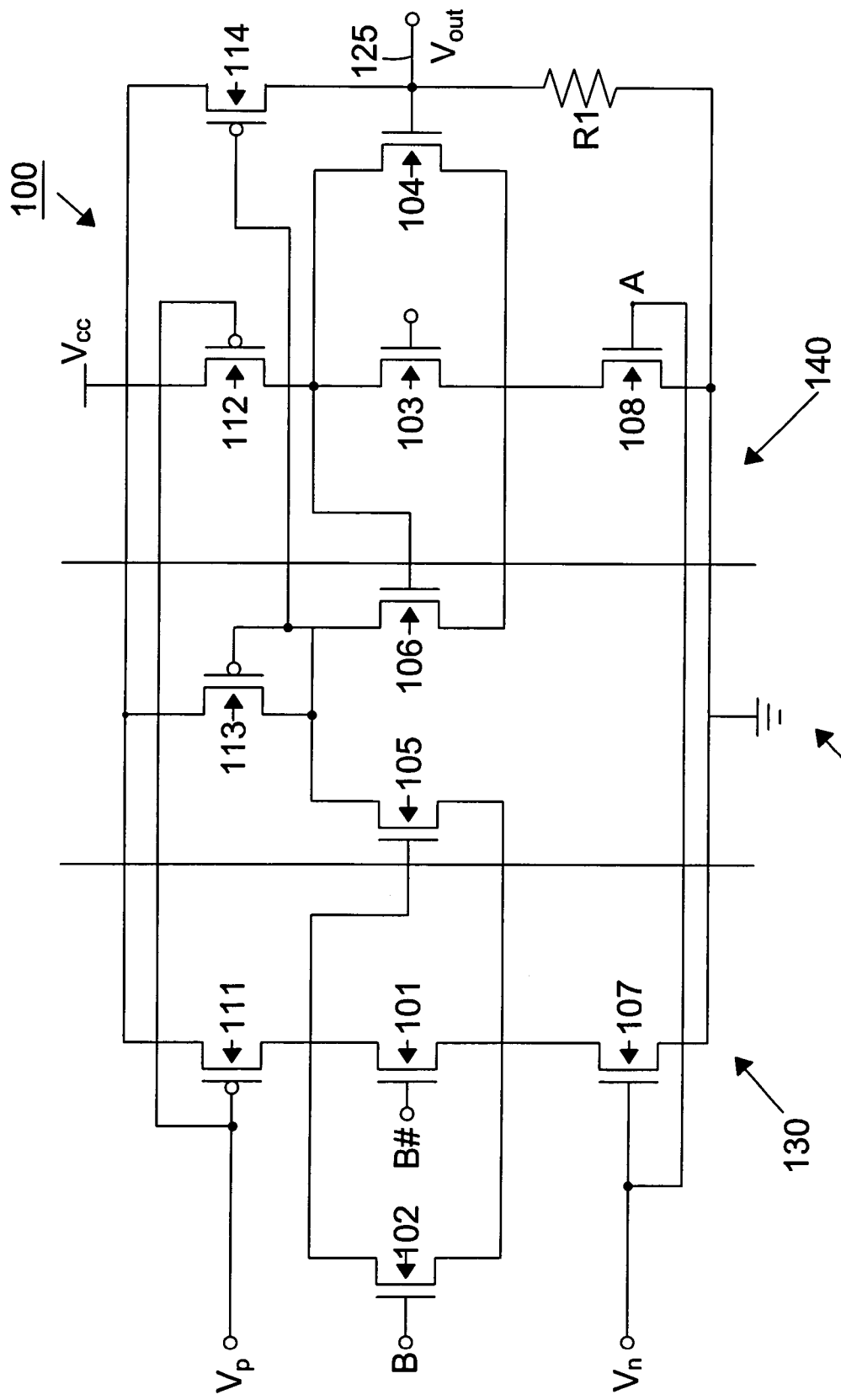
FIG. 2 shows an XOR circuit according to an example embodiment of the present invention.

FIG. 2 shows an XOR circuit 100 according to an example embodiment of the present invention. Other embodiments and configurations are also within the scope of the present invention. The XOR circuit 100 is a symmetric non-stacking CML XOR circuit in which the logic depth (or stacking depth) is one. This non-stacking circuit may provide a higher-speed XOR circuit than in disadvantageous arrangements.

More specifically, FIG. 2 shows two input signals A and B as well as their two complementary input signals A# and B#. The XOR circuit 100 may include a plurality of NMOS transistors 101, 102, 103, 104, 105, 106, 107 and 108, as well as a plurality of PMOS transistors 111, 112, 113 and 114. Other types of transistors are also within the scope of the present invention. For purposes of discussion and illustration, the transistors may be arranged in a left branch 130, a right branch 140 or in a middle branch 150. For example, left branch 130 may include transistors 111, 101, 102 and 107, middle branch 150 may include transistors 113, 105 and 106, and right branch 140 may include transistors 112, 103, 104 and 108. Transistor 114 may also be considered part of middle branch 150. As stated above, this XOR circuit 100 contains one level depth (or logic level) that includes transistors 101, 102, 103, 104, 105 and 106. Thus, the XOR circuit 100 is a non-stacked XOR circuit.

Input signal A may be applied to a gate of transistor 102, input signal B may be input to a gate of transistor 103, complementary input signal A# may be input to a gate of transistor 104 and complementary input signal B# may be input to a gate of transistor 101. As such, the input signals A, B, A#, B# control the switching operations of transistors 101, 102, 103 and 104, and control the output of the XOR logic circuit 100.

A bias voltage Vn may be applied to a gate of transistor 107 and a gate of transistor 108. Transistor 107 may be coupled between GROUND and a source of each of transistors 102, 101, 105. Likewise, transistor 108 may be coupled between GOUND and a source of each of transistors 103, 104, 106. A bias voltage of Vp may be applied to a gate of transistor 111 and to a gate of transistor 112.

A voltage source Vcc may be commonly coupled to a drain of each of transistors 111, 113, 112 and 114. A gate of transistor 114 (forming the current mirror with transistor 113) may be commonly coupled to a source of each of transistors 113, 112, 105, 106. A gate of transistor 113 is also coupled to the gate of transistor 114.

The XOR circuit 100 may further include resistor R1. An output signal (shown as Vout) may be provided on signal line 125 coupled between transistor 114 and resistor R1. The signal output on the signal line 125 represents a logical XOR operation of the input signals A and B (and/or the complementary input signals A# and B#).

The symmetric non-stacking CML XOR gate 100 includes transistors 111 and 112 operating in a linear region and acting as pull-up transistors (or logic), transistors 107 and 108 operating in a saturation region acting as current sources, transistors 101, 102, 103, 104, 105 and 106 acting as a logic switch network, and transistors 113 and 114 acting as a current mirror. The non-stacking of transistors 101–106 not only reduces the total propagation delay but also provides symmetry with a same DC level to the logic input signals A and B.

Operations of the XOR circuit 100 will now be described. If the two logic inputs A and B are different (or substantially different), then the logic inputs A and B# (shown in the left branch 130) are the same and the logic inputs B and A# (shown in the right branch 140) are the same. In this situation, then either transistors 101 and 102 on the left branch 130 are ON (depending on the state of the input signals A and B#) or transistors 103 and 104 on the right branch 140 are ON (depending on the state of the input signals A# and B) so that tail current mainly goes through the left branch 130 or the right branch 140 (without flowing substantially through the transistors 105 and 106) since the transistor 113 is OFF.

On the other hand, if the two logic inputs A and B are the same (or substantially identical), then the logic inputs A and B# (shown in the left branch 130) are different and the logic inputs B and A# (shown in the right branch 140) are different. In this situation, since transistor 113 is ON tail current flows through transistor 113. That is, through the current mirror (i.e., the transistor 113 and 114), the current changes on transistor 114 reflect the current changes on transistor 113 while transistors 105, 106 provide positive feedback.

The output voltage (Vout) is produced in association with resistor R1 according to XOR operations of the input signals with a low voltage swing. That is, the output on the signal line 125 may be HIGH if inputs A and B are different (and/or if the input signals A# and B# are different). On the other hand, the output on the signal line 125 may be LOW if inputs A and B are the same (or if the input signals A# and B# are the same). The gain of the XOR gate 100 may be determined by the value of resistor R1 and the tail current generated by transistors 107 and 108.

Accordingly, embodiments of the present invention may operate such that either: (1) the left or right branch opens (or turns ON) to allow tail current to flow therethrough (when the input signals A and B are different, for example); or (2) the current is blocked from passing through the left branch and the right branch and the current flows in the middle branch (when the input signals A and B are the same, for example). One example is that when input signals A and B are the same (and thus the input signals A# and B# are also the same), then the tail current flows through transistors 113, 105 and 107 and/or the current flows through the transistors 113, 106 and 108. This results in a LOW output signal on signal line 125.

Figure 3:
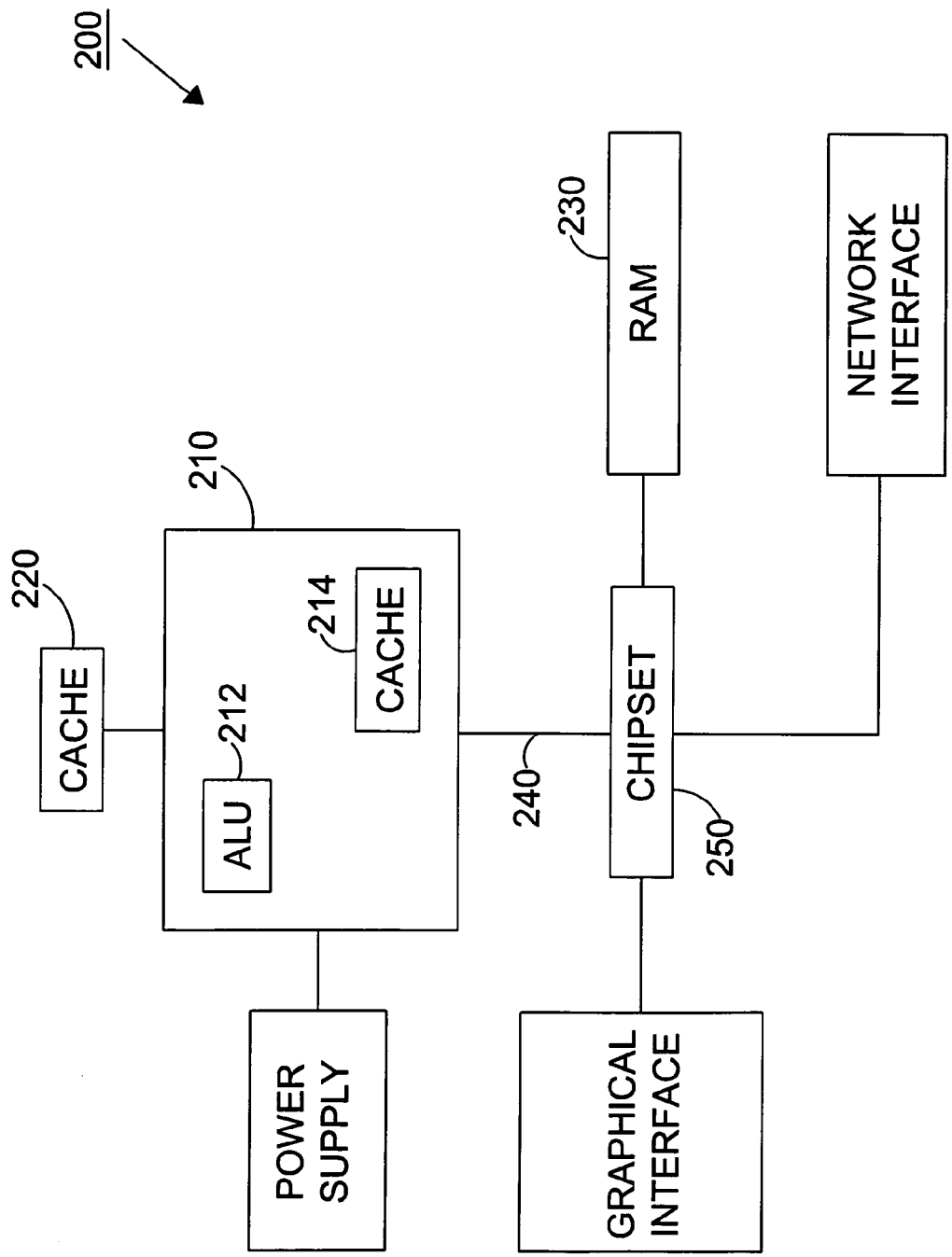
FIG. 3 is a system level block diagram according to an example embodiment of the present invention.

FIG. 3 is a system level block diagram of a system (such as a computer system 200) according to example embodiments of the present invention. Other embodiments and configurations are also within the scope of the present invention. More specifically, the computer system 200 may include a microprocessor 210 that may have many sub-blocks such as an arithmetic logic unit (ALU) 212 and an on-die cache 214. Microprocessor 210 may also communicate to other levels of cache, such as off-die cache 220. Higher memory hierarchy levels such as a system memory (or RAM) 230 may be accessed via a host bus 240 and a chip set 250. In addition, other off-die functional units such as a graphics accelerator and a network interface controller, to name just a few, may communicate with the microprocessor 210 via appropriate busses or ports. Embodiments of the present invention may be provided within the system 200, such as within a phase-locked loop (PLL) and/or a delay-locked loop of the microprocessor 210. That is, microprocessor 210 may include a CML XOR logic circuit 100 as discussed above.

Embodiments of the present invention may also be provided within any of a number of example electronic systems. Examples of represented systems include computers (e.g., desktops, laptops, handhelds, servers, tablets, web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A XOR logic circuit comprising:
   a pair of pull-up transistors;
   a pair of current source transistors; and
   a non-stacked logic switch network coupled between the pull-up transistors and the current source transistors, the non-stacked logic switch network including a plurality of transistors divided into a first branch, a second branch and a third branch, a tail current flowing through the first branch, the second branch or the third branch based on at least two input signals to the plurality of transistors of the non-stacked logic switch network.

2. The XOR logic circuit of claim 1, further comprising a current mirror including at least two current mirror transistors, and one of the two current mirror transistors provided in the second branch.

3. The XOR logic circuit of claim 2, further comprising an output signal line to provide an output signal indicative of a logical XOR operation of the at least two input signals, the output signal line being coupled to another one of the two current mirror transistors.

4. The XOR logic circuit of claim 2, wherein the tail current flows through the first branch or the third branch when the at least two input signals are substantially different.

5. The XOR logic circuit of claim 4, wherein the one of the two current mirror transistors is OFF when the tail current flows through the first branch or the third branch.

6. The XOR logic circuit of claim 2, wherein the tail current flows in the second branch when the at least two input signals are substantially identical.

7. The XOR logic circuit of claim 6, wherein the one of the two current mirror transistors is ON when the current flows in the second branch.

8. The XOR logic circuit of claim 1, wherein the XOR logic circuit comprises a current mode logic (CML) XOR logic circuit.

9. The XOR logic circuit of claim 1, wherein the first branch is a left branch, the second branch is a middle branch, and a third branch is a right branch of the XOR logic circuit.

10. A current mode logic (CML) XOR logic circuit comprising:
    a plurality of transistors divided into a first branch, a second branch and a third branch, a tail current flowing through the first branch, the second branch or the third branch based on two input signals input to two of the plurality of transistors and two corresponding complementary input signals input to another two of the plurality of transistors;
    two current mirror transistors, at least one of the two mirror transistors provided in the second branch; and
    an output signal line to provide an output signal indicative of a logical XOR operation of the two input signals, the output signal being based on the tail current flowing through the first branch, the second branch or the third branch.

11. The CML XOR logic circuit of claim 10, further comprising:
    a pair of pull-up transistors; and
    a pair of current source transistors, the plurality of transistors coupled between the pull-up transistors and the current source transistors.

12. The CML XOR logic circuit of claim 10, wherein the at least two current mirror transistors form a current mirror.

13. The CML XOR logic circuit of claim 10, wherein the tail current flows through the first branch or the third branch when the two input signals are substantially different.

14. The CML XOR logic circuit of claim 13, wherein the one of the two current mirror transistors is OFF when the current flows through the first branch or the third branch.

15. The CML XOR logic circuit of claim 10, wherein the tail current flows in the second branch when the two input signals are substantially identical.

16. The CML XOR logic circuit of claim 15, wherein the one of the two current mirror transistors is ON when the current flows in the second branch.

17. The CML XOR logic circuit of claim 10, wherein the plurality of transistors comprise a non-stacked logic switch network.

18. An electronic system comprising:
    a memory to store data; and
    a processor to process the data stored in the memory, the processor including a current mode logic (CML) XOR logic circuit to perform a logical XOR operation, the CML XOR logic circuit including:
        a pair of pull-up transistors;
        a pair of current source transistors; and
        a logic switch network including a plurality of transistors divided into a first branch, a second branch and a third branch, a tail current flowing through the first branch, the second branch or the third branch based on input signals to the plurality of transistors and based on complementary input signals to the plurality of transistors, the CML XOR logic circuit also including at least two current mirror transistors, and one of the two current mirror transistors provided in the second branch.

19. The electronic system of claim 18, wherein the tail current is based on two input signals input to two of the plurality of transistors and two corresponding complementary input signals input to another two of the plurality of transistors.

20. The electronic system of claim 18, wherein the at least two current mirror transistors form a current mirror.

21. The electronic system of claim 20, wherein the current flows in the second branch when the input signals are substantially identical.

22. The electronic system of claim 21, wherein the one of the two current mirror transistors is ON when the current flows in the second branch.

23. The electronic system of claim 18, the CML XOR logic circuit further including an output signal line to provide an output signal indicative of a logical XOR operation of the at least two input signals, the output signal line being coupled to the other one of the two current mirror transistors.

24. The electronic system of claim 18, wherein current flows through the first branch or the third branch when the input signals are substantially different.

25. The electronic system of claim 24, wherein the one of the two current mirror transistors is OFF when the current flows through the first branch or the third branch.

* * * * *